US009209712B2

(12) United States Patent
Deml et al.

(10) Patent No.: US 9,209,712 B2
(45) Date of Patent: *Dec. 8, 2015

(54) OUTPUT MODULE AND METHOD FOR OPERATING THE OUTPUT MODULE

(71) Applicant: Siemens Aktiengesellschaft, Munich (DE)

(72) Inventors: Michael Deml, Bruck (DE); Martin Fichtlscherer, Kastl (DE); Sevan Haritounian, Amberg (DE); Sebastian Kemptner, Fensterbach-Duernsricht (DE); Thomas Kiendl, Wernberg-Koeblitz (DE); Mathias Koenig, Neuhaus an der Pegnitz (DE); Reinhard Mark, Hersbruck (DE); René Vogel, Hersbruck (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/973,566

(22) Filed: Aug. 22, 2013

(65) Prior Publication Data

US 2014/0062536 A1    Mar. 6, 2014

(30) Foreign Application Priority Data

Aug. 29, 2012 (EP) ..................... 12182162

(51) Int. Cl.
*H03B 1/00* (2006.01)
*H03K 3/00* (2006.01)
*H02M 11/00* (2006.01)
*H03K 17/12* (2006.01)

(52) U.S. Cl.
CPC ............... *H02M 11/00* (2013.01); *H03K 17/12* (2013.01)

(58) Field of Classification Search
CPC ......... H02M 11/00; H02M 1/08; H02M 1/38; H02M 3/335; H02M 1/34; H03K 17/22; H03F 1/0205; H03F 3/185; H03F 3/68; H05B 33/08; H05B 33/0815; H05B 33/0827; H05B 33/0845
USPC .......................... 327/108, 109, 112; 323/282
See application file for complete search history.

(56) References Cited

U.S. PATENT DOCUMENTS

| 6,249,111 | B1 * | 6/2001 | Nguyen ...................... 323/282 |
| 2003/0223168 | A1 | 12/2003 | Ely |
| 2008/0012623 | A1 | 1/2008 | Oster et al. |
| 2009/0206909 | A1 | 8/2009 | Chen et al. |
| 2011/0235227 | A1 | 9/2011 | Fox |

FOREIGN PATENT DOCUMENTS

DE    10 2006 030 448    1/2008
EP    2 369 744    9/2011

* cited by examiner

*Primary Examiner* — John Poos
(74) *Attorney, Agent, or Firm* — Cozen O'Connor

(57) ABSTRACT

A method for operating an output module having an output circuit by which a voltage resulting in a current is connected to a load connected to an output, wherein a first driver module is operated and activated via a first control input to connect a voltage to the output, a second driver module is operated in parallel with the first driver module and activated via a second control input to also connect a voltage to the output, at a start time a control circuit receives a switching command for switching the voltage to the output, and wherein the control circuit initially starts by reciprocally activating the first and second control inputs respectively for a first time period, and wherein during this reciprocal activation, the first and second driver modules conduct the current for each respective duration of first and second activation periods.

11 Claims, 4 Drawing Sheets

OUTPUT MODULE AND METHOD FOR OPERATING THE OUTPUT MODULE

BACKGROUND OF THE INVENTION

1. Field of the Invention

The invention relates to a method for operating an output module having an output circuit by which a voltage is connected to a load connected to an output, wherein between a supply-voltage terminal of the output module and the output, a first driver module is operated and is activated via a first control input to connect a voltage to the output.

2. Description of the Related Art

For switching, e.g., capacitive loads by a preferably failsafe digital output module of a programmable logic controller, power electronic components are nowadays already being used to switch the positive output voltage in an output module. These power electronic components are preferably in the form of semiconductor switching elements.

In particular, when switching on capacitive loads having a low series resistance, a high switch-on current occurs in the first instant. For power components that have a means of switching off the current in the event of a short-circuit, this high current can trip a mechanism for detecting an overcurrent or short-circuit current and hence switch off the power component, which is not wanted.

Unpublished application DE 10 2006 030 448 A1 discloses an output circuit for an output module for switching at least one connected load.

Since output modules, i.e., in automation engineering, are continuously reducing in overall size, a solution is sought that limits heating to allowable levels or keeps the power dissipation as low as possible for a reduced overall size of the output module, and a further increase in the packing density of electronic components on a printed circuit board of the output module.

SUMMARY OF THE INVENTION

It is therefore an object of the invention to provide an output module that makes it possible, particularly when switching capacitive loads, to manage the high input current that prevails at the start of a switching operation but without overloading the output module by the resultant heat dissipation.

This and other objects and advantages are achieved in accordance with the invention by providing a method for operating an output module having an output circuit by which a voltage is connected to a load connected to an output, where between a supply-voltage terminal of the output module and the output, a first driver module is operated and is activated via a first control input to connect a voltage to the output, such that between the supply-voltage terminal and the output, a second driver module is operated in parallel with the first driver module and is activated via a second control input also in order to connect a voltage to the output, where a control circuit receives at a start time a switching command for switching the voltage to the output, and in a first step the control circuit starts by reciprocally activating the first control input and the second control input respectively, and where the reciprocal activation is performed for the duration of a first time period, and during this reciprocal activation, the first driver module conducts the current for each duration of a first activation period, and the second driver module conducts the current for each duration of a second activation period. The two driver modules connected in parallel and the reciprocal activation of the driver modules over time make it possible to increase a potential switchable capacitive load or the maximum allowable switch-on current. During a transition period extending from a switch-on instant to an almost-charged capacitance, only one of the two driver modules is ever active. The first driver module is switched on first for the first activation period, where the time length of the first activation period is not enough to trigger an automatic switch-off as a result of an overcurrent in the first driver module. If the first driver module is then switched off or no longer activated, the second driver module is switched on virtually simultaneously for a second activation period, which likewise is not sufficient to trigger the overcurrent detection mechanism for a switch-off, despite the high current that is now flowing. Preferably, one of the driver modules is always switched on and conducting current while the respective other driver module is switched off. The result of this reciprocal switching to and fro between the two driver modules is that a capacitive load can be charged. A resultant power dissipation is thus shared equally between two components and causes a lower temperature rise per driver module than when using just one driver module.

For the purpose of switching off when there is an overcurrent, the first driver module and the second driver module are each operated by a current switch-off device, which devices are configured to allow a maximum current only for a certain period of an allowance time period, and to switch off the current when the allowance time period is exceeded.

Here, the first and second activation periods are each selected to be less than the individual allowance time periods of the respective current switch-off devices.

When a capacitance to be switched is almost charged, in a second step, which follows the reciprocal activation of the first and the second driver modules, after the first time period has elapsed, both driver modules are activated simultaneously.

By the start of the second step of the method, the current has meanwhile dropped to an extent that both driver modules can now be switched on permanently, although the current is shared between two driver modules to minimize the permanently resulting power dissipation in the output module even though a high switch-on current no longer prevails.

In an alternative to the constant time period, the current is measured by a current measuring instrument, and the reciprocal activation of the driver modules is operated in the first step irrespective of the first time period until the measured current has dropped below a predetermined value. Thereafter, operation can be switched directly to continuous operation of both driver modules.

In addition, it is possible to measure via a voltage measuring instrument an output voltage at the output, and to operate the reciprocal activation of the driver modules in the first step irrespective of the first time period until the measured voltage has exceeded a predetermined value. Again thereafter, operation can be switched directly to continuous operation of both driver modules.

The method in accordance with the invention is used particularly advantageously for output modules that are operated as a failsafe automation component designed for functional safety.

Particularly in failsafe applications, it is advantageous to extend the method such that the second driver module is operated using an open-circuit testing device and is activated periodically for open-circuit testing of a line fed to the load, where the first driver module is switched off during this test period.

It is also an object of the invention to provide an output module comprising an output circuit, an output, a supply-voltage terminal, a first driver module having a first control input, where the first driver module is configured to connect a voltage to the output and is arranged between the supply-voltage terminal and the output, and a second driver module having a second control input is arranged, between the voltage-supply terminal and the output, in parallel with the first driver module and is also configured to connect a voltage to the output, where a control circuit has a command input, a first command output and a second command output, and is configured to receive at a start time via the command input a switching command for switching the voltage to the output, and to start switching the voltage to the output by reciprocally activating the first control input and the second control input respectively, and is furthermore configured such that the reciprocal activation is performed for the duration of a first time period, and the first driver module conducts current for the duration of a first activation period, and the second driver module conducts current for the duration of a second activation period.

In the presently contemplated embodiment, both driver modules preferably comprise semiconductor components having a low on-state resistance. Relatively low resistance values of less than a few milliohms are measured, for example, in a field effect transistor in a fully-on state. Minimum switching losses can be achieved by such a low on-state resistance, and hence a continuous power dissipation can also be minimized.

If semiconductor switching elements having such a low on-state resistance are now used, however, then it is advantageous that the first driver module and the second driver module are each configured to have a current switch-off device, which devices are configured to allow a maximum current only for a certain period of an allowance time period, and to switch off the current when the allowance time period is exceeded.

In an advantageous embodiment, the output module is embodied such that the control circuit is additionally configured to activate, following the reciprocal activation of the first driver module and the second driver module, after the first time period has elapsed, both driver modules simultaneously. A resultant power dissipation is thus shared equally between two driver modules, and causes a lower temperature rise per driver module than when using just one driver module.

In order to be able to respond flexibly for different maximum switch-on currents, it is advantageous if the output module comprises a current measuring instrument, which measures the current, where the control circuit is additionally configured to operate the reciprocal activation of the driver modules irrespective of the first time period until the measured current has dropped below a predetermined value.

In addition, a voltage measuring instrument can be present, which measures a voltage at the output, where the control circuit is additionally configured to operate the reciprocal activation of the driver modules irrespective of the first time period until the measured voltage has exceeded a predetermined value.

In particular with reference to using an output module for failsafe automation components designed for functional safety, the second driver module comprises an open-circuit testing device, which is designed for periodic open-circuit testing of a line fed to the load.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment, in which.

DETAILED DESCRIPTION OF THE PREFERRED EMBODIMENTS

Figure 1:
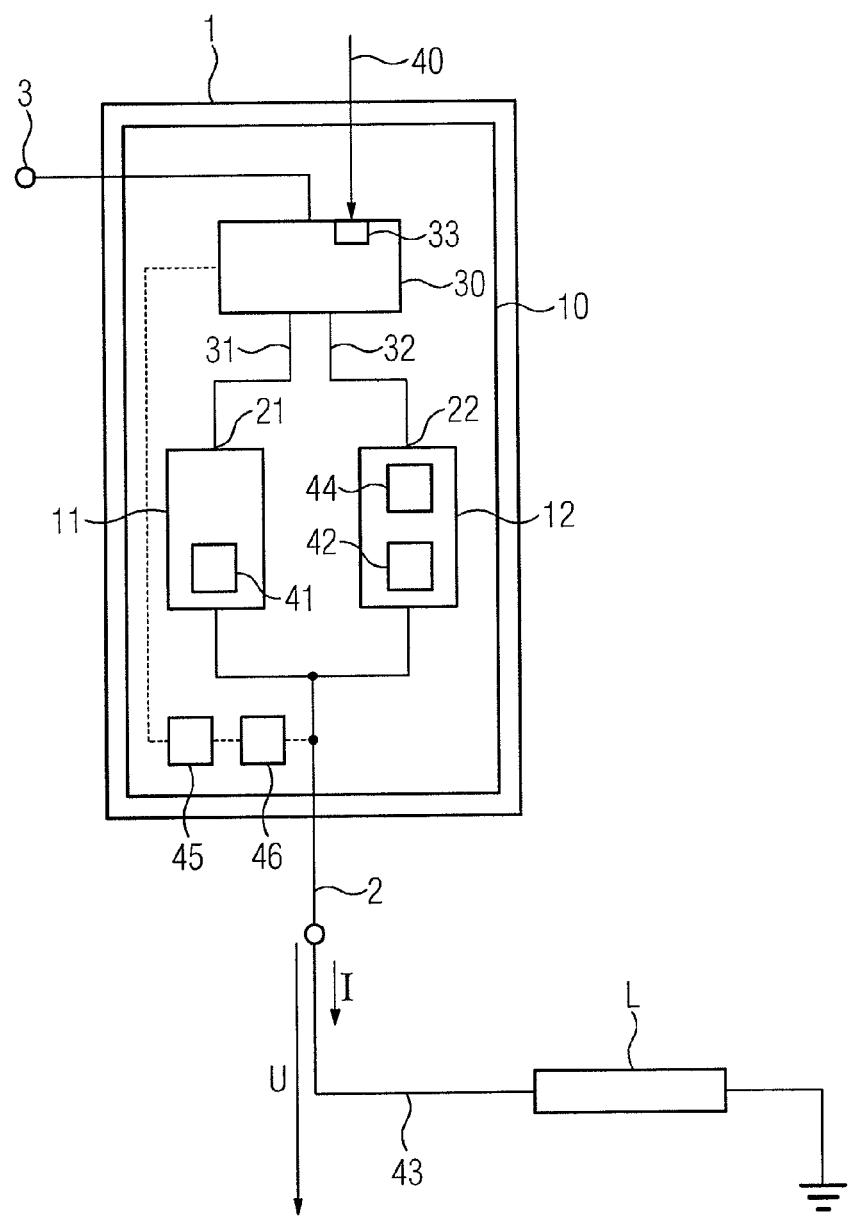
FIG. 1 shows an output module 1 having a first driver module and a second driver module.

FIG. 1 shows an output module 1 comprising an output circuit 10, an output 2, a supply-voltage terminal 3, a first driver module 11 having a first control input 21, and a second driver module 12 having a second control input 22. The output module 1 is configured to switch via its output circuit 10 a voltage U to a load L via an output 2.

In order to keep a resultant power dissipation in the output circuit 10 within limits, it is proposed to insert two electronic semiconductor switching elements, i.e., the first driver module 11 and second driver module 12, such that the first driver module 11 and the second driver module 12 are arranged in parallel with one another between the supply-voltage terminal 3 and the output 2, where the first driver module 11 and the second driver module 12 are activated reciprocally, with the first driver module 21 being activated via a first control input 21, and the second driver module 12 being activated via a second control input 22.

Accordingly, the control circuit 30, after receiving a switching command 40 to switch the voltage U to the output, is actuated at a start time T0 so as to start in a first step the reciprocal activation of the first control input 21 and the second control input 22 respectively, where the reciprocal activation is performed for the duration of a first time period T1 (see FIG. 3), and during this reciprocal activation, the first driver module 11 conducts the current I for each duration of a first activation period T11, and the second driver module 12 conducts the current I for each duration of a second activation period T12. The first and second driver modules 11, 12 each comprise a current switch-off device 41, 42. Here, this first current switch-off device 41 and this second current switch-off device 42 are configured to allow a maximum current only for a certain period of an allowance time period TZ, and to switch off the current I when the allowance time period TZ is exceeded.

Once a capacitive load is almost charged to its capacitance, a program implemented in the control circuit 30 can shift to a second step of the method. This second step is performed following the reciprocal activation of the first driver module 11 and the second driver module 12, after the first time period T1 has elapsed, and thereafter activates the first driver module 11 and the second driver module 12 simultaneously.

In an alternative to a fixed time period T1, the output circuit 10 comprises a current measuring instrument 45, which measures the current I, and the reciprocal activation of the driver modules 11, 12 is operated in the first step irrespective of the first time period T1 until the measured current I has dropped below a predetermined value.

It is also possible to measure, via a voltage measuring instrument 46, the output voltage 38 at the output 2, and to operate the reciprocal activation of the driver modules 11, 12 in the first step irrespective of the first time period T1 until the measured voltage has exceeded a predetermined value.

The second driver module 12 comprises an open-circuit testing device 44, where this open-circuit testing device 44 is operated periodically, and performs an open-circuit test of a line 43 fed to the load L, and where the first driver module 11 is switched off during this open-circuit test period.

Figure 2:
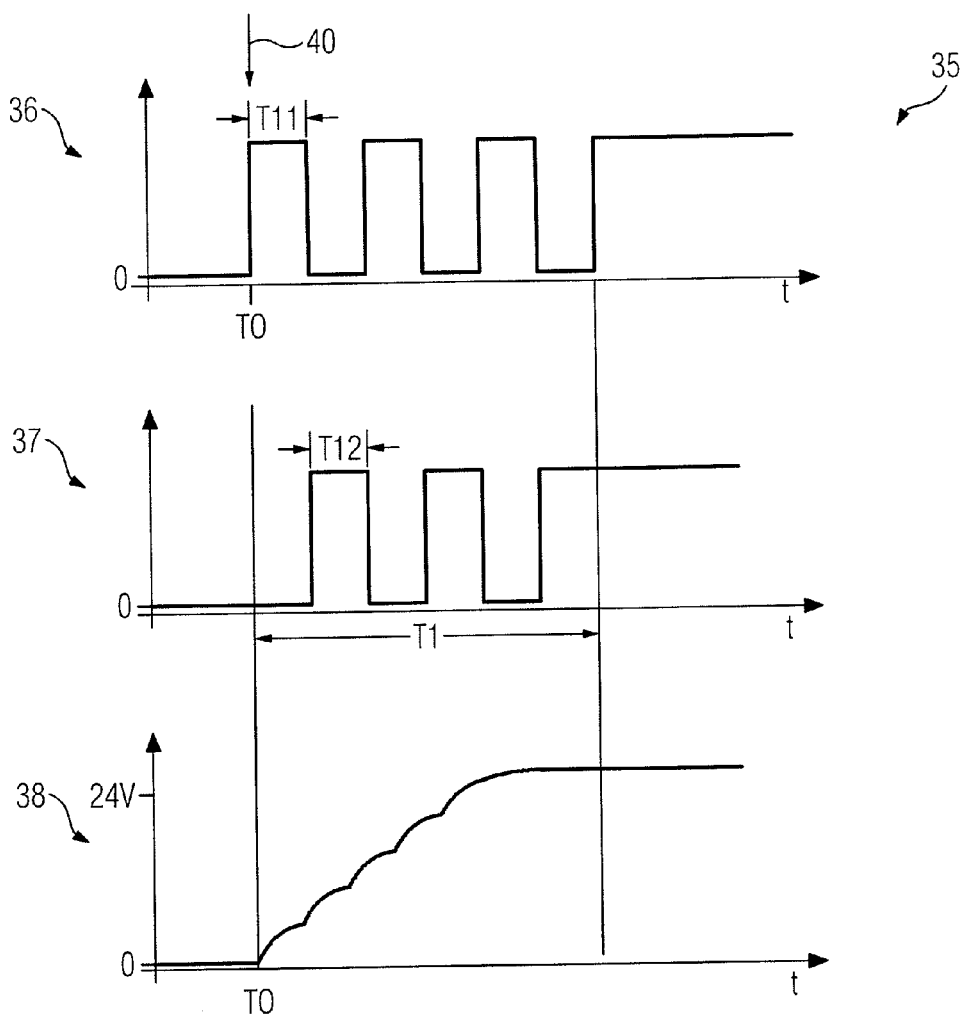
FIG. 2 shows timing diagrams of the activation of the driver modules, and an output voltage at the output.

FIG. 2 shows timing diagrams 35 of the activation of the driver modules 11, 12 and a voltage waveform 38 of the output voltage at the output 2. A first diagram shows a signal waveform 36 at the first control input 21 of the first driver module 11. It shows a logic switching characteristic between "0" and "1" over time t. At a start time T0, the first control input 21 is activated by a logic "1" via the control circuit 30. This activation is performed for a first activation period T11, and after the first activation period T11 has elapsed, the first control input 21 of the first driver module 11 is no longer activated by a "1".

Virtually simultaneously with the switching-off of the first control input 21, the second control input 22 of the second driver module 12 is activated by a second signal waveform for a second activation period T12. After the second activation period T12 has elapsed, activation again switches reciprocally to the first control input so that the first driver module 11 conducts current.

It is assumed that at the end of the time period T1, the capacitance is almost charged and from now on the flowing current I is no longer so high as to result in damaging power dissipation. Therefore, from now on, the first control input 21 and the second control input 22 are activated simultaneously.

A further voltage diagram in FIG. 2 shows the output voltage 38 at the output 2 of the output module 1. At a start time T0, at which the first driver module 11 is activated, the voltage rises gradually. Stepped rises in voltage occur that correspond to the activation periods T11, T12.

Figure 3:
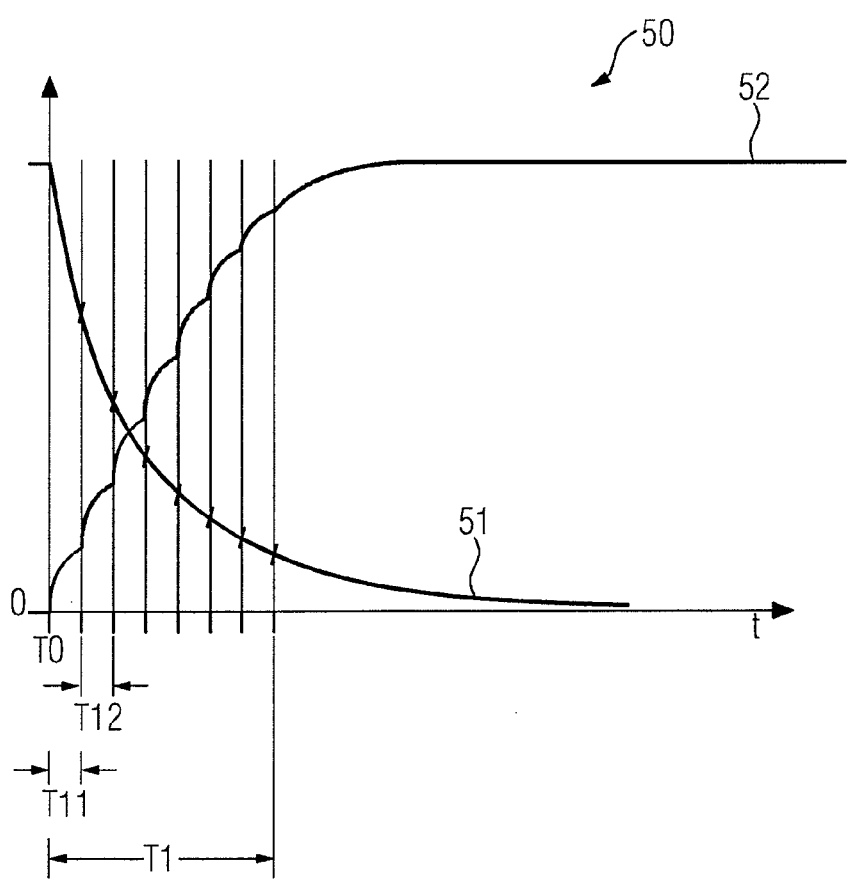
FIG. 3 shows a voltage-current diagram for the load to be switched.

FIG. 3 shows a voltage-current diagram 50, which is intended to illustrate how the current I is shared between two different driver modules 11, 12 by the reciprocal activation of the voltage U. In the diagram, a curve shows the variation 51 over time of the current I, with the current I dropping fairly rapidly after a start time T0 during the first activation period T11. For the duration of the activation period T11, the current I has been loading the first driver module 11. Thereafter, a reciprocal switchover to the second driver module 12 occurs, and for the duration of the second activation period T12 the second driver module 12 is now loaded by the current I. The current I gradually drops, and hence the load on the driver modules 11, 12 also decreases. At the end of the first time period T1, both driver modules 11, 12 can be activated simultaneously via the control inputs 21, 22, because the current I has now decayed such that, figuratively speaking, it is no longer necessary to "toss" it from hand to hand like a hot potato. The curve 52 shows the variation over time of the voltage.

Figure 4:
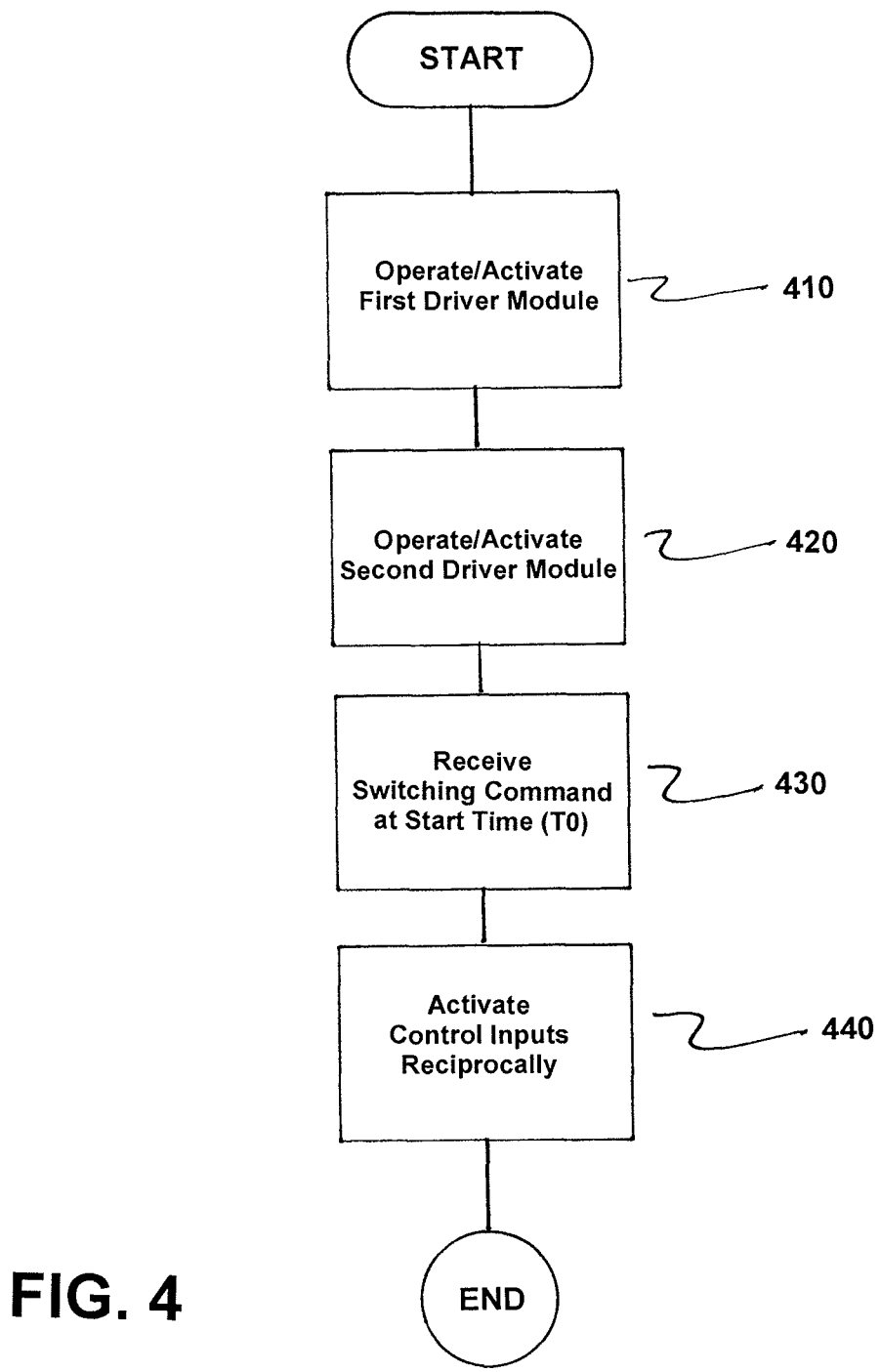
FIG. 4 is a flowchart of the method in accordance with the invention.

FIG. 4 is a flowchart of a method for operating an output module having an output circuit by which a voltage resulting in a current is connected to a load connected to an output. The method comprises operating and activating a first driver module arranged between a supply-voltage terminal of the output module and the output, via a first control input to connect a voltage to the output, as indicated in step 410.

Next, a second driver module, arranged between the supply voltage terminal and the output, is operated and activated in parallel with the first driver module via a second control input to connect the voltage to the output, as indicated in step 420. A switching command for switching the voltage to the output at a start time is now received by a control circuit, as indicated in step 430. The first and second control inputs are initially reciprocally activated by the control circuit, respectively, as indicated in step 440.

In accordance with the method of the invention, the reciprocal activation is performed for a duration of a first time period, and during this reciprocal activation, the first driver module conducts the current for each duration of a first activation period, and the second driver module conducts the current for the duration of a second activation period.

While there have been shown, described, and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for operating an output module having an output circuit by which a voltage resulting in a current is connected to a load connected to an output, the method comprising:

operating and activating a first driver module arranged between a supply-voltage terminal of the output module and the output, via a first control input to connect a voltage to the output;

operating and activating, a second driver module, arranged between the supply-voltage terminal and the output, in parallel with the first driver module via a second control input to connect the voltage to the output;

receiving, by a control circuit, a switching command for switching the voltage to the output at a start time; and initially reciprocally activating, by the control circuit, the first and second control inputs, respectively;

wherein the reciprocal activation is performed for a duration of a first time period, and during this reciprocal activation, the first driver module conducts the current for each duration of a first activation period, and the second driver module conducts the current for the duration of a second activation period; and wherein the current is measured via a current measuring instrument, and the reciprocal activation of the first and second driver modules is operated during said reciprocally activating step irrespective of the first time period until the measured current is below a predetermined value.

2. The method as claimed in claim 1, wherein the first and second driver modules are each operated by a respective current switch-off device is configured to allow a maximum current only for a certain period of an allowance time period, and to switch off the current when the allowance time period is exceeded.

3. The method as claimed in claim 2, wherein the first activation period and the second activation period are each selected to be less than individual allowance time periods of the respective current switch-off device.

4. The method as claimed in claim 1, further comprising: activating the first and second driver modules simultaneously subsequent to the reciprocal activation of the first and second driver modules, after the first time period has elapsed.

5. The method as claimed in claim 1, wherein an output voltage at the output is measured via a voltage measuring instrument, and the reciprocal activation of the first and second driver modules is operated during said reciprocally activating step irrespective of the first time period until the measured output voltage has exceeded a predetermined value.

6. The method as claimed in claim 1, wherein the output module is operated as a failsafe automation component configured for functional safety.

7. The method as claimed in claim 1, wherein the second driver module is operated using an open-circuit testing device and activated periodically for open-circuit testing of a line fed to the load; and wherein the first driver module is switched off during this test period.

8. An output module comprising:
   an output circuit;
   an output;
   a supply-voltage terminal;
   a first driver module having a first control input, the first driver module being configured to connect a voltage to the output and being arranged between the supply-voltage terminal and the output;
   a second driver module arranged between the supply-voltage terminal and the output and in parallel with the first driver module, the second module being configured to connect a voltage to the output;
   a control circuit having a command input, a first command output and a second command output, the control circuit being configured to receive a switching command for switching the voltage to the output at a start time, via the command input, and to start switching the voltage to the output by reciprocally activating the first control input and the second control input respectively, the control circuit being further configured such that the reciprocal activation is performed for a duration of a first time period; and
   a current measuring instrument which measures current;
   wherein the first driver module conducts the current for the duration of a first activation period, and the second driver module conducts the current for the duration of a second activation period;
   wherein the control circuit is further configured to activate, following the reciprocal activation of the first and second driver modules, after the first time period has elapsed, the first and second driver modules simultaneously;
   wherein the control circuit is further figured to operate the reciprocal activation of the first and second driver modules irrespective of the first time period until the measured current has dropped below a predetermined value.

9. The output module as claimed in claim 8, wherein the first driver and second driver modules are each include a current switch-off device which is configured to allow a maximum current only for a certain period of an allowance time period, and to switch off the current only when the allowance time period is exceeded.

10. The output module as claimed in claim 8, further comprising:
    a voltage measuring instrument, which measures a voltage at the output;
    wherein the control circuit is further configured to operate the reciprocal activation of the driver modules irrespective of the first time period until the measured voltage has exceeded a predetermined value.

11. The output module as claimed in claim 8, wherein the second driver module comprises an open-circuit testing device which is configured for periodic open-circuit testing of a line fed to the load.

\* \* \* \* \*